United States Patent

Hadar et al.

[11] Patent Number: 5,931,368
[45] Date of Patent: Aug. 3, 1999

[54] LONG LIFE BONDING TOOL

[75] Inventors: Ilan Hadar; Beni Sonnenreich, both of Haifa, Israel

[73] Assignee: Kulicke and Soffa Investments, Inc, Wilmington, Del.

[21] Appl. No.: 08/828,914

[22] Filed: Mar. 28, 1997

[51] Int. Cl.[6] .................................................. H05K 13/06
[52] U.S. Cl. ............................................. 228/4.5; 228/54
[58] Field of Search ............................... 228/4.5, 1.1, 54, 228/214, 180.5; 76/DIG. 6, DIG. 12

[56] References Cited

U.S. PATENT DOCUMENTS

| | | | |
|---|---|---|---|
| 3,986,653 | 10/1976 | Gilding | 228/4.5 |
| 4,513,190 | 4/1985 | Ellett et al. | 228/1.1 |
| 4,974,768 | 12/1990 | Ebata | 228/54 |
| 5,474,816 | 12/1995 | Falabella | 427/580 |
| 5,516,027 | 5/1996 | Tanabe et al. | 228/54 |

Primary Examiner—Samuel M. Heinrich
Attorney, Agent, or Firm—John B. Sowell Aty

[57] ABSTRACT

The present invention relates to post manufacturing operations for improving the working life of known bonding tools such as capillaries, wedges and single point TAB tools of the type used in the semiconductor industry to make fine wire or TAB finger interconnections. After the desired bonding tool is manufactured to predetermined specifications, dimensions and tolerances, it is placed in a sputtering chamber with hard target material with an ionizing gas. A controlled volume of sputtered hard material is generated at high temperature by plasma ion bombardment and deposited onto the working face of the bonding tool while the tool is held at a temperature that prevents distortion. A very thin amorphous hard layer is bonded onto the working face of the bonding tool which increases the working life of most tools by an order of magnitude and there is no requirement for additional processing.

14 Claims, 5 Drawing Sheets

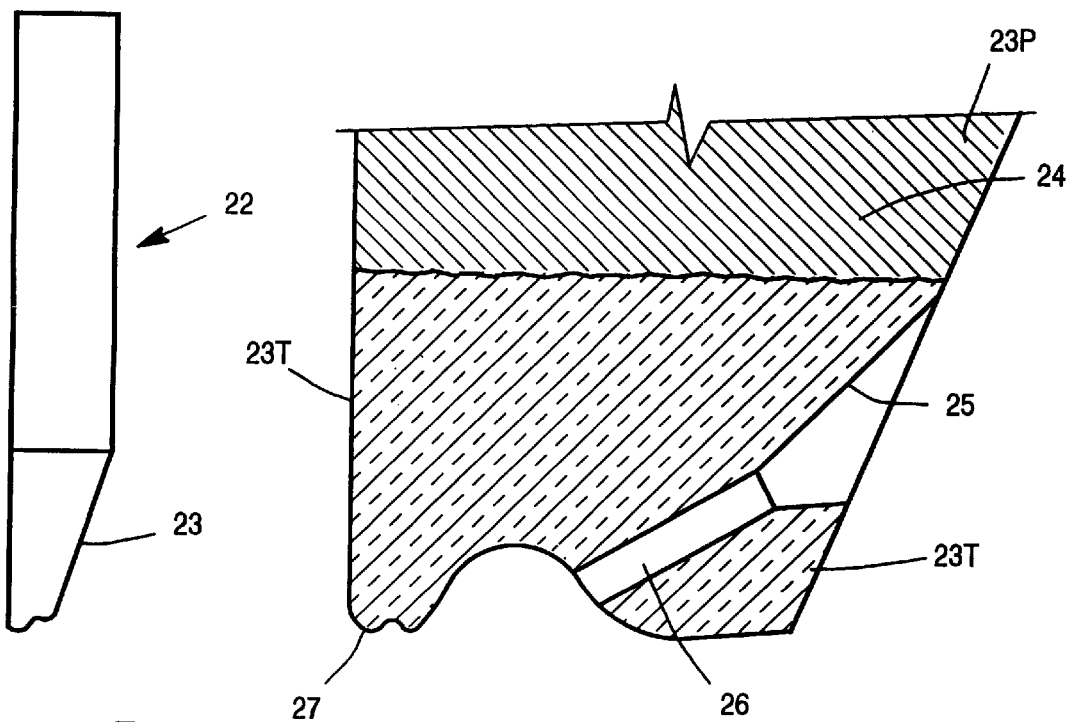
Figure 5
Prior Art
Figure 6
Prior Art
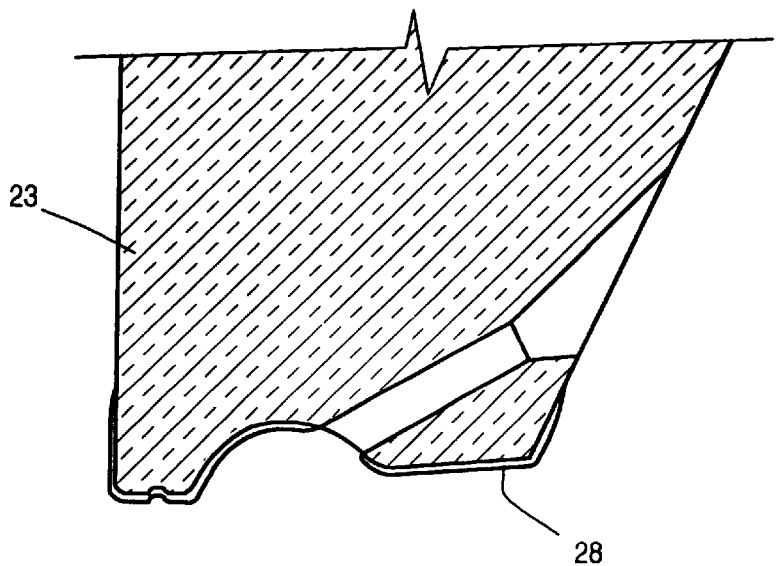
Figure 7

LONG LIFE BONDING TOOL

BACKGROUND OF THE INVENTION

1. Field of the Invention

The present invention relates to bonding tools of the type used in automatic wire bonding machines and tape automated bonding machines to make electrically conductive interconnections between the pads on a semiconductor device and the leads on a frame or carrier. More particularly, the present invention relates to adding a very thin hard coating of amorphous ceramic material to the working face of known bonding tools so that the original specifications and tolerances are preserved and the working face is improved in smoothness and hardness.

2. Description of the Prior Art

Bonding tools used to make fine wire interconnection on semiconductor devices are commercially produced as capillary bonding tools or as wedge bonding tools. By far the larger percentage of such tools are capillary bonding tools. Either type tool may be modified to produce a single point bonding tool of the type used to connect a prefabricated flexible pattern of leads to pads on a semiconductor device in a process called the tape automated bonding or TAB. Each of the three types of tools have been made in more than one type of working face in order to solve different problems.

A current problem is excessive wear of the working face of each bonding tool used for very small bonding pads on a semiconductor device. The pads are presently smaller than 3.0 mils square on high density computer chips of the type which typically drive the state of the art. The next generation computer chip will have 2.0 mil square pads. The bonding tools used to make wire bonds or TAB bonds on these pads must have a working face that does not extrude or expand the bond being made over the edges the pads. This requires that the tip diameter (T) of the fine pitch bonding tool be made about the size of the pad and that the working face which extrudes the wire or tab lead be effectively smaller that than the fine pitch pad size or under 3.0 mils.

The above requirements, when imposed on fine pitch bonding tools have resulted in smaller working faces on high speed bonding tools of the type shown and described in U.S. Pat. Nos. 5,421,503 and 5,558,270 that are assigned to the assignee of the present invention. It was found that the mean time before replacement of these prior art tools has been reduced by over 50% and the next generation of fine pitch bonding tools will have a further reduced operational life.

It would be desirable to provide capillary or wedge type bonding tools which can be made on existing production machinery using existing materials and methods of manufacture that can be further processed in a manner which more than doubles the operational life of the bonding tool.

SUMMARY OF INVENTION

It is a principal object of the present invention to provide a new and improved longer lasting bonding tool than existed heretofore.

It is another principal object of the present invention to provide a method of making a long lasting bonding tool without changing the tolerance dimensions of the prior art tools.

It is another object of the present invention to employ an inherent high temperature post operative sputtering step for coating a thin hard layer of glass like ceramic material onto a bonding tool while controlling the surface temperature of the bonding tool being coated.

It is another object of the present invention to limit the deposition of a ceramic coating being applied to a bonding tool to a desired predetermined working face area.

It is another object of the present invention to provide a novel method of substantially increasing the hardness of the working face of a bonding tool without affecting the size or hardness of the remainder of the bonding tool.

It is another object of the present invention to provide a novel method of selectively hardening portions of the bonding tool to increase the working life in production.

According to these and other objects of the present invention there is provided a microminiature fine pitch bonding tool having a working face width or thickness less than four mils across and having tolerances limited to fractions of a mil. A thin hard layer of ceramic material is sputtered onto the working face of the bonding tool at a controlled temperature between 200° to 800° centigrade to deposit a layer less than one micron in thickness which increases the hardness by about fifty percent and increases the useful life by about one order of magnitude.

BRIEF DESCRIPTION OF THE DRAWINGS

FIG. 5 is a side view of a typical prior art wire bonding wedge preferably made from a sintered carbide having heat and electrical conductive characteristics;

FIG. 6 is an enlarged elevation in section showing the end of the bonding tool shown in FIG. 5 which has bonded thereto a tip made of a very hard material such as diamond or diamond alloy;

FIG. 7 is an enlarged elevation in section showing the end of the bonding tool shown in FIG. 5 having a tip made of the same material as the shank portion which has a very hard thin layer made integrally with the working face of the homogeneous shank which may comprise alumina, ceramic carbides or diamond.

DETAILED DESCRIPTION OF THE PREFERRED EMBODIMENTS

Figure 1:
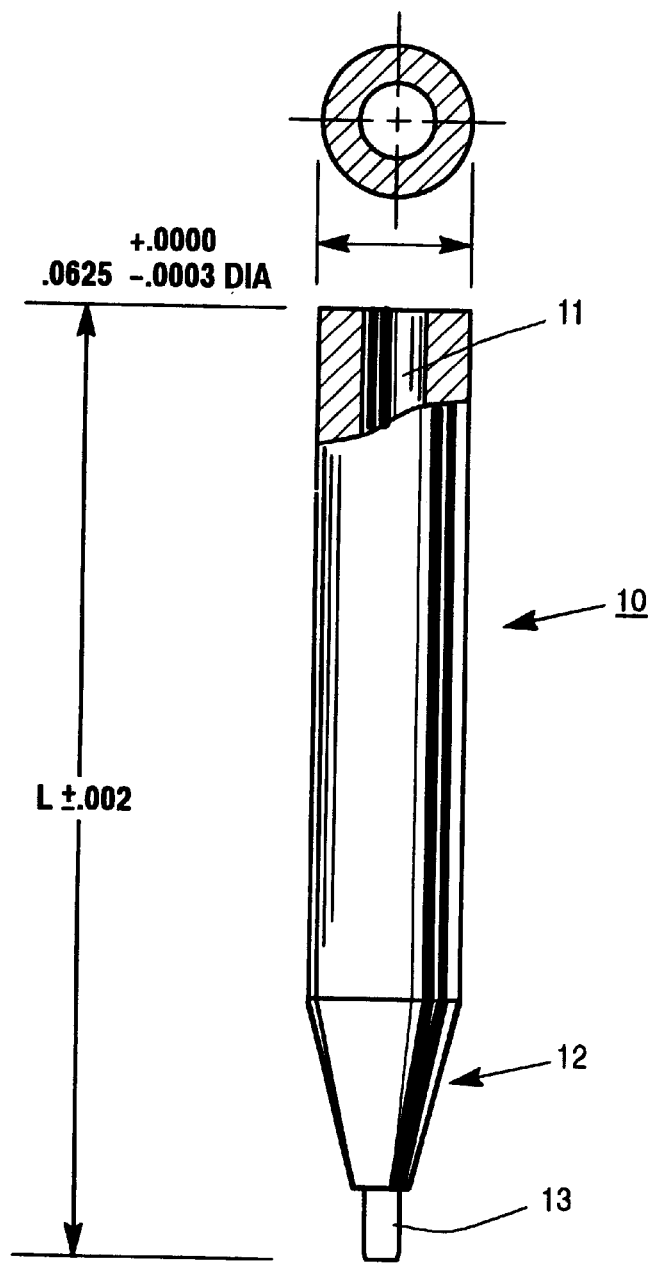
FIG. 1 is a side view of a typical prior art wire bonding capillary preferably made from a high density insulating alumina.

Refer now to FIG. 1 showing a typical prior art capillary bonding tool 10 having a through-hole 11. Such tools, made of ceramic material, are used in automatic wire bonders to make gold ball bonds. The capillary is shown having a 30° cone 12 with a tapered bottle neck tip 13 and an overall length (L) which may be specified up to approximately two inches. The most common material for such capillary bonding tool is pure alumina which is compacted or pressed into a high density non-porous elongated body that is machined and polished at the working face, chamfer and through-hole to provide a tool having high fracture toughness and long wear.

Figure 2:
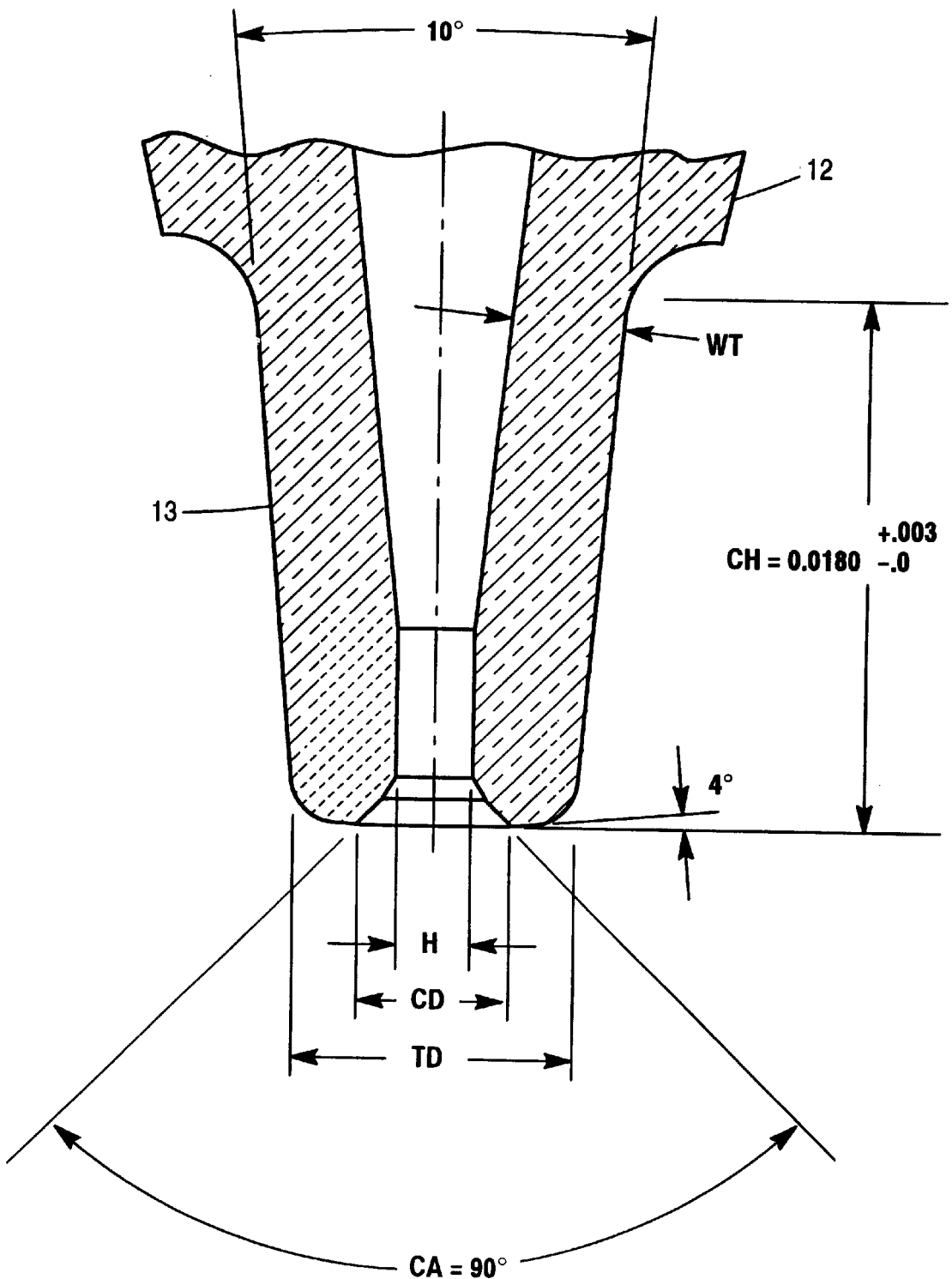
FIG. 2 is an enlarged elevation in cross section showing the tip of the bonding tool shown in FIG. 1.

Refer now to FIG. 2 showing an enlarged cross section of the tip 13 of capillary 10 of FIG. 1. The bottle neck cone angle is preferably ten degrees and the wall thickness (WT) is preferably uniform and at least 2.0 mils thick to avoid compressive stress fractures during bonding operations. The tolerances for the hole diameter (H) the chamfer diameter (CD) and the tip diameter (TD) for a tool designed for use with twenty-five micron (25M) gold wire are as follows:

H=38, tolerance +4; −3 microns

CD=64, tolerance +5; −5 microns

TD=152, tolerance +8; −8 microns

These tolerances are typical and must be maintained to enable a bonding machine operator to replace the bonding tools and be assured that the replacement tool is a full equivalent of the tool being replaced, otherwise the critical bonding times and forces would have to be recalibrated for each tool use. It is not uncommon to replace bonding tools used for fine pitch wire bonding several times during one work shift. It is a principal feature of the present invention to improve the same tools made from the same materials and built to the same tolerances by the same process steps described above and to lengthen its working life by at least one hundred percent up to one thousand percent.

Figure 3:
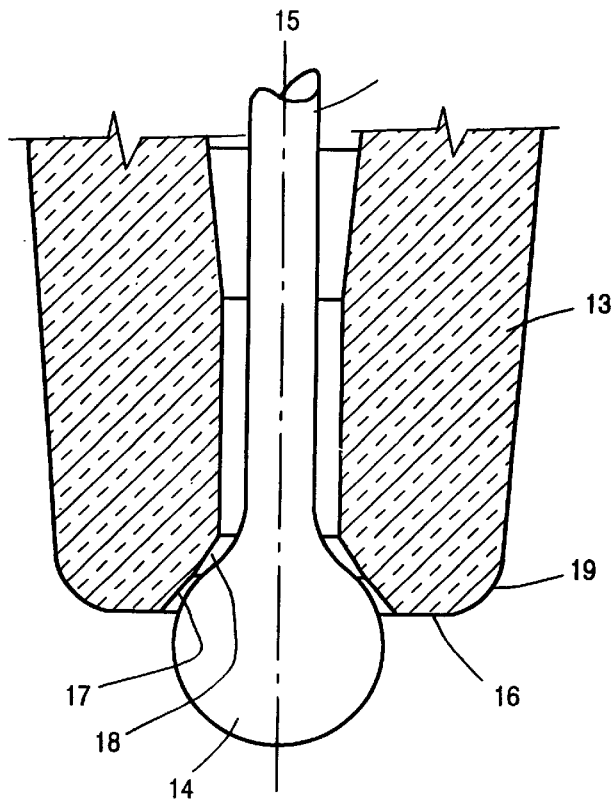
FIG. 3 is a greatly enlarged elevation in cross section showing the working face of the tip of a ceramic capillary bonding tool of the type shown in FIGS. 1 and 2 before being treated by the present invention method.

Refer now to FIG. 3 showing the working face of a tip 13 of a typical prior art ceramic capillary bonding tool prior to engaging a spherical gold ball 14 on the end of a gold wire 15. The ball 14 is made by flaming-off or melting a tail portion of wire which extends from the capillary after second bond. The process is not exact and repeatable and as a result the ball diameter may vary in size, thus, it is even more important that the working face of the bonding tool be maintained as originally specified and built. For purposes of the present invention, the term working face includes those surfaces which contact the wire during a bonding operation. Thus the working face includes two truncated cones or inner chamfers 17 and 18 which engage and squash the ball 14 during a first bond operation. During a second bond operation the wire extends laterally under the annular face 16 and is mashed and deformed by the outer radius 19.

Figure 4:
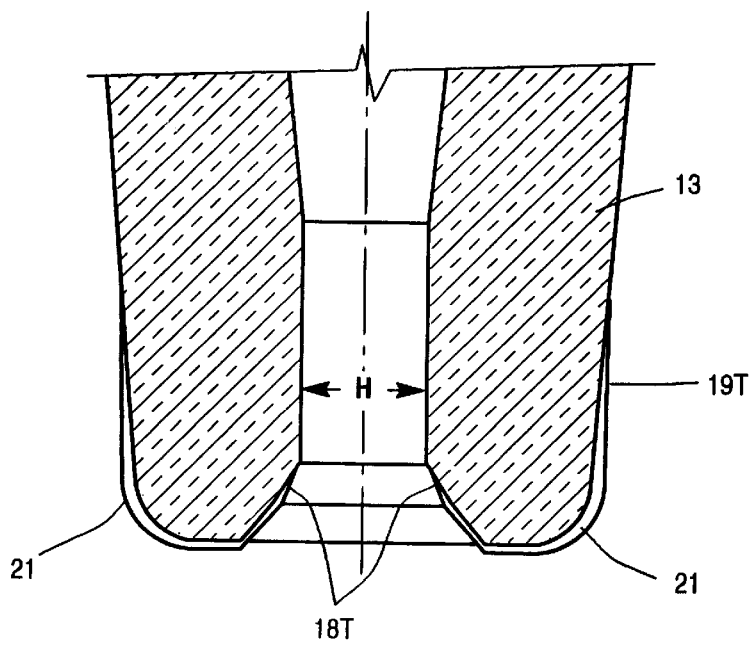
FIG. 4 is a cross section view of the bonding tool shown in FIG. 3 after being further processed to increase the hardness of the working face by a factor greater than two without exceeding the tolerances of the original tool.

Refer now to FIG. 4 showing the tip 13 as shown in FIG. 3 after being further processed according to the present invention. An amorphous ceramic thin hard layer 21 is shown covering the working face 16 to 19. A tapered portion 18T is formed on the inner cone and terminates short of the through-hole H. Similarly, the tapered portion 19T at the outer radius rapidly diminishes to zero. It will be understood that the thickness of the layer 21 is preferably 0.3 to 0.5 microns in uniform thickness on the working face and is not deposited over the outside of tip 13 or to any noticeable degree in the through-hole H which could affect or change the operation of the wire feed during a bonding operation.

The thickness of the layer 21 is shown exaggerated. Preferably, it may range from 0.1 to 5.0 microns for other applications it is preferably maintained so small that the manufacturing tolerances of the original tools are not exceeded. When the layer 21 is applied at a high bonding temperature while the tip 13 is held as low as 200°C., the tool does not distort nor does it require any re-work or polish.

It is well known in the prior art that sputtering and/or deposition of coating are high temperature processes. For purposes of explanation of this phenomena reference is made to U.S. Pat. No. 5,516,027 which describes a typical method of chemical vapor deposition (CVD). Various materials are deposited on a substrate at substrate temperatures close to 900° C. It is explained that coatings of diamond, diamond alloys or ceramic when applied at high temperatures incur internal stresses which cause separation and/or cracking. To overcome the cracking and separation problems this patent teaches making a multi-layered vapor deposited diamond film having a thickness of 40 to 390 microns on a compatible substrate at temperatures of about 900° C. The hard multi-layered diamond is removed from the substrate leaving a very hard film which is metallized, then attached by brazing to a bonding tool shank. It is also suggested that the bonding face of the TAB bonding tool be polished before use.

In contrast to this complex and expensive process involving a plurality of steps and a base or substrate on which the hard coating is made, applicants having successfully deposited thin hard ceramic layers directly onto known bonding tools made of ceramic metal and sintered carbides. Further, applicants' process is capable of depositing any material capable of being sputtered in a plasma region onto any known bonding tool material. The range of sputterable metals and materials so applicable are set forth in U.S. Pat. No. 5,516,027 to include at least B, Al, Fe, Mo, P, Sb, Si, Li, S, Se, Ce, Ni, W, Ta, Re, W, Co and Cr. Vapor deposits of diamond adhere well to SiC, $Si_3 N_4$, WC, Mo, W and BN.

Refer now to FIG. 5 showing a side view of a typical prior art wedge bonding tool 22 of the type which are typically made of a sintered metal carbide such as tungsten carbide, titanium carbide and tool steels. The same shape tool has been made heretofore having a hard tips brazed or bonded onto the shank portion as will now be explained with reference to FIG. 6 which shows an enlarged elevation in section of the tip 23.

The tip portion 23, which is part of wedge 22 comprises a tough shank portion 23P and a hard working tip portion 23T which is attached at interface bond 24 by brazing or molecular bonding techniques. Wedge tip 23T is shown having a wire guide comprising a conical funnel 25 and a wire guide hole 26 for positioning a wire (not shown) under toe 27 which comprises the working face. This hard tip bonded to a tungsten carbide shank is shown and described in U.S. Pat. No. 3,627,192 issued in 1971 and became a standard which is still used. The prior art tool employed a stiff tungsten carbide shank 23P provided with a bond tip 23T of an extremely hard material described therein as a tip comprising osmium fused or brazed at 24 to the end of the wedge 22. This patent teaches that osmium alloys and other refractory alloys described therein as well as diamond or diamond alloys may be brazed or fused to the shank.

The identical shape wedge bonding tool has been modified by eliminating the wire guide for use as a single point TAB bonding tool and is shown and described in U.S. Pat. No. 5,217,154 showing the tip portion made of polycrystalline diamond (PCD) which formed by making a sintered compress of diamond powder which can be bonded together with the use of a metal catalyst/binder when subject to suitable high pressure and high temperatures as is well described in U.S. Pat. No. 4,629,373. Both references are incorporated herein by reference thereto. In summary these references teach that a tip of very hard carbides and/or diamond alloys and/or polycrystalline tips may be attached by bonding to a preferred shank material to provide longer wearing bonding tools. The above-mentioned patents teach it was heretofore impossible to manufacture a finished tough shank portion 23P separate and apart from a finished hard tip portion 23T and then join them in a manner which would result in a finished wedge bonding tool 22 without further machining and/or polishing. The method by which the prior art hard tip tools are made demands that the bond 24 be made before finished machining takes place, otherwise the distortion caused by heat of bonding will warp and misalign the two parts when any attempt is made to fuse or bond them together. The applicants in the present invention have done the equivalent of the impossible in the present invention.

The plasma vapor deposited plural diamond layers produced for use on TAB bonding tools described in U.S. Pat. No. 5,516,027 could be bonded onto the tool shown in FIG. 6, however the problem remains. If the diamond layers are deposited onto the shank 23P, they must be post machined and/or polished to achieve the desired working face profile. If the multi-layered diamond is made as a separate part for bonding onto the shank it cannot be machined as a finished tip for bonding onto a finished shank.

Refer now to FIG. 7 showing an end portion of the bonding wedge shown in FIG. 5. The shank portion 22 including the tip 23 made of one material such as a tough carbide or tool steel having a hard tip 23T. After the tool 22 is finished to final manufacturing size, finish and tolerance a very hard very thin layer 28 is bonded onto the working face by sputtering while holding the working face of the tip (substrate) at a temperature preferably below 200° C. The best results were obtained when the very hard layer 28 was deposited as an amorphous ceramic having a thickness less than one micron.

Prior art layers of diamond far exceed this thickness, thus, if such prior art teaching were followed the working face of the tip 23 would have to be machined and polished extensively to obtain a desired finished size and profile.

Figure 8:
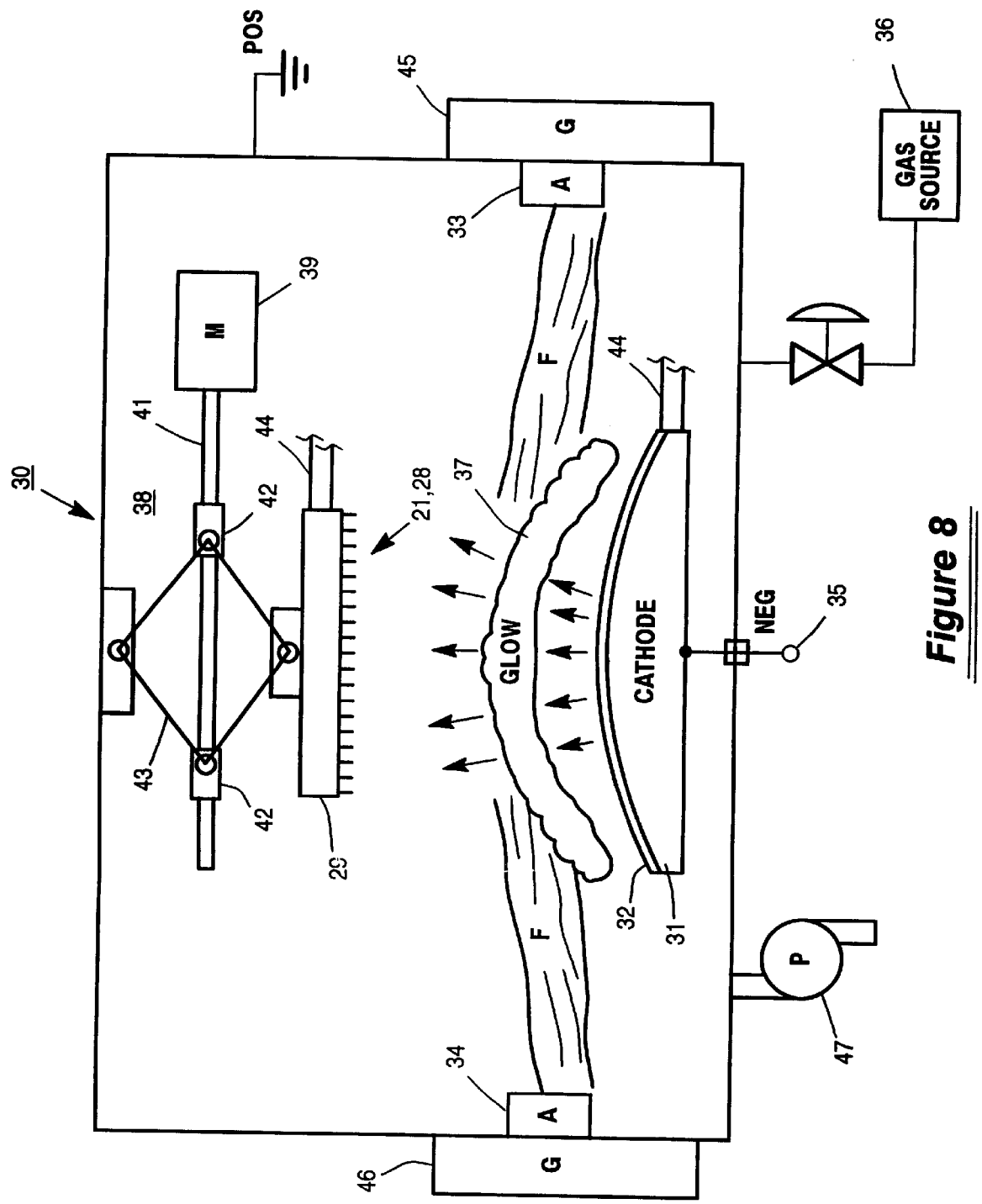
FIG. 8 is a schematic view of a preferred sputtering chamber adopted to deposit the very hard thin layer at temperatures so low that they do not change the dimensions or tolerances of the original bonding tool.

Refer now to FIG. 8 showing a schematic view of a sputtering chamber of the type suitable for use in directly depositing very hard, very thin layers of material 21, 28 onto the working face of conventional shaped bonding tools 10, 22 to provide enhanced wear bonding tools without post operational machining or polishing. Hard layers 21, 28 of amorphous alumina, silicon, zirconium nitride, titanium nitride and silicon carbide having a Vickers hardness of approximately 3000 are easily deposited in thicknesses between 0.3 and 0.5 microns while controlling the tolerance to ±one-tenth of one micron. It is possible to deposit thicker layers 21, 28 up to and exceeding five microns, however, no advantages were noted and the thicker layers were more prone to fracture.

In one example, a finish commercially available capillary 10 made from high purity alumina was manufactured as a finished product ready for shipment as a prior art tool. The tool had a Vickers hardness of ≈2000 before the layer 21 was added and a working face hardness of approximately Vickers 3000 after layer 21 was deposited. The RMS finish of the working face of different materials was improved. The deposited material was alumina deposited on alumina as amorphous alumina. Clearly, the increased hardness of alumina on alumina was unpredictable.

In a second example, finished commercially available bonding wedge 22 was manufactured to final dimensions and tolerances from blanks of tungsten carbide. Again a very hard layer of amorphous alumina was deposited on the working face as shown in FIG. 7 to a thickness of 0.1, 0.2, 0.3, 0.4 and 0.5 microns. The Vickers hardness increased from ≈1900 to over 3000. The working life of the tools having a 0.3 micron layer was increased by a factor of 3. The working life of other tools were all increased.

Other high strength amorphous materials having high fracture hardness and toughness provide layers 21, 28 having compressive strength of 2500 to 3500 kilograms/MM$^2$ and equal or improved RMS surface finish. While alumina, zirconium, SiN, SiC are known to produce desirable amorphous layers the amount of diamond in the diamond like amorphous carbon in such a layer that produces optimum hardness is not easily determinable, however, the amorphous diamond like layer is very hard and is not polycrystalline.

In every example tested the Vickers hardness of the working face 21, 28 could be increased. The useful life of the coated tools was increased by a factor greater than the ratio of the increase in Vickers hardness.

The bonding tools 10, 22 were placed in rack 29 juxtaposed cathode 31 having a source of material 32 to be sputtered onto the tools. The chamber 30 and the anodes 33, 34 were grounded and a negative power source 35 was coupled to a 10–100K electron-volt power supply (not shown), creating a high voltage potential between the anodes 33, 34 and the cathode 31. The chamber was provided with a sputtering gas mixture of argon and oxygen from source 36. The ions created formed a glow discharge plasma region 37 which caused the gas ions to impact the cathode material 32 and drive off atomic particles which move from the cathode 32 toward the working faces 21, 28 of the tools positioned opposite the glow area 37. The rack 29 was mounted for adjustable movement in chamber 30 by positioning means 38 schematically shown as a motor 39 driving a screw 41 threaded in bushings 42 connected to an expandable frame 43.

The tools 10, 22 in rack 29 and the cathode 31 are preferably water cooled by means of supply 44. A pair of field generators 45, 46 generate a field F which focuses the gas ion into the glow region 37 and assist in containing the hot glow region away from the tools 10, 22 so that temperature of the tools could be maintained below those known to cause distortion. The pressure of the ionizable gas was maintained relative low by pump 47 but sufficient to maintain a self-sustaining glow discharge and disposition with high sputtering rates. It is known that dopants and alloy gases can be introduced into chamber 30 to create oxide and nitride layers, however, it is not obvious that vapor deposition (sputtering) of diamond and diamond alloys may be created which deposit out on the working faces 21, 28 of the tools in the manner described hereinbefore. The sputtering chamber described herein may be any commercially available chamber modified to maintain the glow area away from the tools being coated. The impact of atoms of material being deposited is controlled to maintain the working face of the tools below distortion temperatures. The chamber shown and described in PCT publication WO95/22638 can easily be modified for this purpose.

Having explained a preferred embodiment tool and the method used to deposit different material directly onto the working face of finished bonding tools which require no post deposit finishing, it will be understood that the desired or optimum conditions and results described herein may be modified. The desired low temperature of the working face of the bonding tool are controlled to prevent distortion of the finish tool and may be operable up to 800° for some blank materials. The thickness of the very hard layers 21, 28 are preferable held only as thick as needed for an optimum or near optimum result. It is known that layers 21, 28 in excess of 0.5 microns are quite effective and those below 0.3 microns are operable as well as layers that range from 0.1 to 10.0 microns.

It is known that the finished tools do not warp, distort, or change tolerances when deposited well below 500°–600° C. and that a range of 200°–300° C. has been and is consistently operable and desirable, thus, the scope of the invention claimed should be interpreted within the bounds of the description and not by the preferred parameters which insure a high yield of parts without perceptible deviation from the high standards desired for production parts.

We claim:

1. A fine pitch bonding tool of the type used in automatic wire bonding machines for interconnecting a conductive lead between fine pitch bonding pads on a semiconductor device and targets on a lead out device, said tool comprising:

an elongated body having a fine pitch working face on a tip end for engaging said conductive lead and for making a molecular bond between the conductive lead and the bonding pads and/or the lead out device, said elongated body having means for clamping the end opposite the pipe end in a bonding tool holding device while making said molecular bond, said working face of said body having a narrow tool width (T) under 3.0 mils in diameter and sides adjacent to the working face which define said tip end, and a thin hard layer of amorphous material less than 5.0 microns thick bonded directly to the working face of bonding tool forming as a substantially uniform thickness layer over the working face of said bonding tool and which diminishes in thickness along the sides of said tip end;

said think hard layer of amorphous material having a Vickers hardness greater than the body of said bonding tool causing said bonding tool to have a longer wear life than the ratio of increase in Vickers hardness.

2. A fine pitch bonding tool as set forth in claim 1 wherein the Vickers hardness of said thin hard amorphous material is approximately 3000.

3. A fine pitch bonding tool as set forth in claim 2 wherein said thin hard layer of amorphous material on said working face comprises a layer of alumina about 0.3 microns in thickness.

4. A fine pitch bonding tool as set forth in claim 2 wherein said thin hard layer of amorphous material on the working face of said bonding tool comprises a layer approximately 0.1 to 1.0 microns in thickness.

5. A fine pitch bonding tool as set forth in claim 1 wherein said elongated body comprises a capillary having a wire hole through the body and said amorphous material consist of high density alumina which does not change the wire hole size.

6. A fine pitch bonding tool as set forth in claim 1 wherein said elongated body comprises a sintered metal and the thin hard layer of amorphous material comprises a layer of sputtered metal having a Vickers hardness of approximately 3000.

7. A fine pitch bonding tool as set forth in claim 1 wherein said bonding tool comprises a completely finished manufactured bonding tool made from metal or metal alloys to manufacturing specifications which include plus and minus tolerances from −3 to +8 microns, and said thin hard layer of amorphous material is so thin that said bonding tool is still completely finished and with the original manufacturing specification.

8. A fine pitch bonding tool as set forth in claim 7 wherein bonding tool is made from a compacted or sintered metal, and said amorphous material comprises a metal or metal alloy.

9. A fine pitch bonding tool as set forth in claim 8 wherein said amorphous material comprises a metal which includes said compacted or sintered metal.

10. A fine pitch bonding tool as set forth in claim 7 wherein said hard layer of amorphous material comprises atomic particles of diamond.

11. A fine pitch bonding tool of the type used in automatic bonding machines for interconnecting a conductive lead to bonding pad targets on a semiconductor device, said targets on said device having a fine pitch less than 3.0 mils in diameter, said tool comprising:

an elongated body having a working face on a tip end smaller than said targets for engaging said conductive lead and for making molecular bond between the conductive lead and the bonding pad targets and/or the lead out device, said elongated body having means for clamping the end opposite the tip end in a bonding tool holding device while making said molecular bond, and said working face and said body forming a completed bonding tool, a very thin hard layer of amorphous material bonded directly to the working face of said completed bonding tool forming a substantially uniform thickness layer less than 2.0 microns thick over the working face of said bonding tool and which diminishes in thickness along the sides of said tip end, whereby said very thin hard layer of amorphous material having a hardness greater than said completed bonding tool causing said completed bonding tool to have a longer wear life than the ratio of increase in hardness.

12. A fine pitch bonding tool as set forth in claim 11 wherein the Vickers hardness of said thin hard amorphous material is approximately 3000.

13. A fine pitch bonding tool as set forth in claim 11 wherein said very thin hard layer of amorphous material on said working face comprises a layer of metal alumina.

14. A fine pitch bonding tool as set forth in claim 12 wherein said very thin hard layer of amorphous material on said working face comprises a layer of non-metallic carbon deposited as atomic particles of diamond.

* * * * *